(12) United States Patent
Weckström

(10) Patent No.: US 6,643,518 B1
(45) Date of Patent: Nov. 4, 2003

(54) METHOD AND APPARATUS FOR SYNCHRONIZING TELECOMMUNICATIONS DEVICES VIA A TRANSMISSION NETWORK

(75) Inventor: Mikko Weckström, Helsinki (FI)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 09/456,658

(22) Filed: Dec. 9, 1999

Related U.S. Application Data

(63) Continuation of application No. PCT/FI98/00525, filed on Jun. 17, 1998.

(30) Foreign Application Priority Data

Jun. 17, 1997 (FI) .................................................. 972592

(51) Int. Cl.$^7$ ............................................... H04B 15/00
(52) U.S. Cl. ...................... 455/503; 455/3.05; 455/502; 725/62
(58) Field of Search ............................... 455/3.01, 3.03, 455/3.04, 3.05, 3.06, 422, 13.2, 22, 402, 426, 503, 70, 502; 725/62; 375/358, 359, 371

(56) References Cited

U.S. PATENT DOCUMENTS

| | | | |
|---|---|---|---|
| 5,124,980 A | 6/1992 | Maki | |
| 5,339,184 A | 8/1994 | Tang | |
| 5,381,459 A | 1/1995 | Lappington | |
| 5,390,235 A | 2/1995 | Beasley | |
| 5,638,422 A | 6/1997 | Roman | |
| 5,825,884 A | * 10/1998 | Zdepski et al. | ............... 455/4.2 |
| 5,875,396 A | * 2/1999 | Stockton et al. | ............. 455/4.2 |

FOREIGN PATENT DOCUMENTS

| | | |
|---|---|---|
| GB | 2 289 198 | 11/1995 |
| GB | 2 300 549 | 11/1996 |
| JP | 7-184144 | 7/1995 |

OTHER PUBLICATIONS

Dec. 3, 1998, International Search Report for PCT/FI98/00525.

* cited by examiner

Primary Examiner—Edward F. Urban
Assistant Examiner—Charles R. Craver
(74) Attorney, Agent, or Firm—Squire, Sanders & Dempsey LLP

(57) ABSTRACT

For synchronous transmission between two telecommunications units, the devices must always be synchronized. Typically, a reference signal is required for synchronization. The reference signal can be transmitted from one unit to another embedded in the data signal. If the data is transmitted via a transmission network modulated in the way required by the network, the reference signal is not always received by the receiver together with the data signal. The problem is solved by this invention by converting the reference signal before its transmission into the transmission network for the frequency band used for transmission in the transmission network.

11 Claims, 9 Drawing Sheets

METHOD AND APPARATUS FOR SYNCHRONIZING TELECOMMUNICATIONS DEVICES VIA A TRANSMISSION NETWORK

This application is a continuation of international application No. PCT/F198/00525 filed Jun. 17, 1998.

FIELD OF THE INVENTION

The present invention relates to the transmission of a reference signal necessary for the mutual synchronization of telecommunications devices in a transmission network.

BACKGROUND OF THE INVENTION

For any synchronous transmission between two telecommunications devices, the devices involved must always be synchronized. Among other things, synchronization is required for compensation of frequency errors between the devices. Typically, synchronization is carried out using a reference signal relayed to all the devices involved in transmission. Terminal devices may receive this reference signal from the transmission network they are using. Alternatively, one of the devices involved transmits a reference signal that the other devices can then use for synchronization.

An example of an arrangement where one of the two transmission devices in a system synchronizes with another device by means of a reference signal transmitted by the former is transmission between a Base Transceiver Station BTS and its distributed Antenna Unit AU in a telecommunications network. Traditionally, such transmission is carried out by means of special cabling laid between the Base Transceiver Station and the Antenna Unit. However, if one Base Transceiver Station is to be connected to several distributed Antenna Units, the cost of cabling may prove prohibitive.

Data can also be transmitted between the Base Transceiver Station and its Antenna Unit via a separate, already existing transmission network. An example of such a transmission network that is readily available is the cable television network. At present, the cable television network is fairly extensive and offers unused capacity, making it possible to use it for the transmission of data other than just the television signal. As it is, in addition to television signals, the cable television network is also being used, for example, for transmitting other data using the so-called cable modems.

FIG. 1 shows an example of a system where the signal between the base transceiver station BTS 101 and the antenna unit AU consisting of the transmitter TX 105 and receiver 111 is transmitted via a separate transmission network. The transceiver unit (not shown) is connected to an antenna, by means of which the mobile stations can communicate with the base transceiver station and make use of -the services offered by the network. For the sake of clarity, the figure only shows one antenna unit AU, but the same base transceiver station can communicate simultaneously with several transceivers. In this example, the transmission network is a cable television network, where the signal is transmitted following conversion for the frequency of the television channel used for transmission.

The modulated signal with a bandwidth of 200 kHz on the 1930–1990 MHz band in an air interface traffic channel conforming to the mobile communications system specifications and which is to be transmitted from the base transceiver station to the transmitter TX of the antenna unit AU is converted in the adapting unit 102 for the free channel on the band used for the connection in a transmission network. For the connection, the band 180–810 MHz may be selected, with the exception for certain narrow bands that are disallowed. At the receiving end, the signal is converted by the adapting unit 104 into its original band of 1930–1990 MHz.

The signal in the 1850–1910 MHz band to be transmitted by the antenna unit receiver RX to the base transceiver station BTS is converted in the adapting unit 112 for the band 10–105 MHz to be used for the connection in the transmission network. At the receiving end, the signal is re-converted in the adapting unit 114 into its original band 1850–1910 MHz. In addition to the traffic channel signal, the reference signal $S_{REF}$ required for the synchronization of the terminal devices must also be transmitted over the transmission network.

The frequency ranges to be used are not critical to the use of the system, and so the GMS-1900 frequencies used in this example can be replaced by GSM frequencies, in which case the signal from the base transceiver station to the transmitter TX is in the 935–960 MHz band and the signal from the receiver-to the base transceiver station in the 890–915 MHz band, or DCS-1800 frequencies, in which case the signal from the base transceiver station to the transmitter TX is in the 1805–1880 MHz band and the signal from the receiver to the base transceiver station in the 1710–1785 MHz band.

The operation of the transmitting-end adapting units 102 and 112 is discussed below.

Generally, the task of the adapting units is to convert the signal modulated to the frequency $f_1$ into such a form that the signal can be transmitted over a channel operating in the frequency f. Let us first examine the processing of just the modulated signal to be transmitted over a traffic channel. The operation of the adapting unit 102 in FIG. 1 is illustrated in FIG. 2. Except for the frequency bands to be used, the adapting unit 112 operates in an identical manner. The unit input consists of the modulated downlink signal $S_{201}$ in the band 1930–1990 MHz obtained by modulating the signal s(t) to be transmitted by the base transceiver station over the traffic channel. In the adapting unit 102, the signal S201 is first converted in the mixer 202 by means of the mixing signal $S_{MIX}$ having another frequency of $f_{MIX}$. Thus, the signal $S_{202}$ is obtained in addition to the input signals, $$S_{202}=S_{201} \cdot S_{MIX}, \tag{1}$$

where two frequencies are present, $f_{TCH}+f_{MIX}$ and $f_{TCH}-f_{MIX}$ ($f_{TCH}$ being the frequency of the modulated traffic channel signal $S_{201}$ and $f_{MIX}$ the frequency of the mixing signal $S_{MIX}$). $f_{MIX}$ is selected so that one of the two frequency components of the mixed signal is consistent with the frequency channel of the transmission network to be used (such as a cable television network). If, for example, a modulated traffic channel signal with a frequency of 1951 MHz is to be adapted for transmission in a cable television network at a frequency of 546 MHz, the mixing frequency $f_{MIX}$ of 1405 MHz will be selected. At the same time, the other signal components remain outside the frequency range of the channel reserved for transmission, and so they must be filtered. This is achieved by means of the band-pass filter 203, which filters the signal components that fall outside the frequency range of the channel operating at the frequency f (e.g. 545 MHz<f<555 MHz). The signal $S_{203}$ obtained from the band-pass filter is fed into the transmission network.

The signal s(t) travels in the transmission network in its original bandwidth but at a new center frequency $f=f_{TCH}-f_{MIX}=546$ MHz. The signal $S_{203}$ conforms to the band reserved in the cable television network for the connection between the transceiver station BTS and transmitter TX and can be fed into the cable television network as it is.

At the receiving end, the modulated traffic channel signal $S_{201}$ sent from the base transceiver station BTS to the transmitter TX and converted by the adapting unit 102 will be reconstructed by the adapting unit 104, FIG. 1, whose operation is explained in FIG. 3. Similarly, the signal from the receiver RX to the base transceiver station BTS converted- by adapting unit 112 is reconstructed by unit 114 in exactly the same way, except for the frequency bands. Several signals are being transmitted in the transmission network (such as a cable television network) simultaneously over several channels, the individual signals constituting the total signal S. The channel for the transmission connection is selected by suppressing the other signals by means of the band-pass filter 301. The signal $S_{301}$ with a center frequency of $f_{TCH-fMIX}=546$ MHz obtained must be re-converted for its original frequency band of $f_{TCH}$. To accomplish this, the signal is mixed in the mixer 302 using the mixing signal $S'_{MIX}$ with a frequency of $f_{MIX}$ generated by the signal generator 312 to produce the signal $S_{302}$.

Following processing by the mixer 302, the signal includes, in addition to the input signals, two new frequency components, namely the original frequency $f_{TCH}\approx 1951$ MHz and the second side band $|f_{TCH}-2f_{MIX}|\approx 860$ MHz obtained as a result of mixing. Any superfluous and interfering frequency components are eliminated by the band-pass filter 303, and the required component $S_{303}$ with the frequency $f_{TCH}$ is amplified by the amplifier 304 to produce the signal $S_{304}$ which is a copy of the original signal $S_{201}$ shown in FIG. 2 and transmitted from the transmitting end.

The mixing signals $S_{MIX}$ and $S'_{MIX}$ in FIGS. 2 and 3 must have exactly the same frequency because a difference in frequency will produce a frequency error in the signal $S_{304}$ to be transmitted over the transmission network, the said error being equivalent to the difference in frequency. To ensure that the signal $S_{304}$ to be transmitted via the radio path has the a sufficiently accurate frequency and to enable the transmitting and receiving ends to communicate, the transmitting and receiving ends must be synchronized. For example, the GSM specifications require a frequency accuracy of ±0,2 ppm, which means that the equipment must be accurately synchronized and remain so. Synchronization can be achieved by means of sufficiently accurate clocks at both the receiving and transmitting ends. However, clocks of such accuracy are too expensive for commercial applications. Typically, a common reference signal is used for transmission between devices.

Let us examine a situation where a reference signal in a system such as illustrated in FIG. 1 is transmitted from the base transceiver station BTS to the adapting units 102, 104, 112 and 114, to the transmitter 115 and the receiver 111. Thus, the adapting unit 102 must transmit both the downlink traffic channel signal and the reference signal intended for the receiving end. The adapting unit 112 does not have to transmit any reference signal. Otherwise in terms of operation, the unit 112 is identical with the unit 102 except for the frequency bands used, so that an analysis of the operation of the unit 102 is sufficient in this context. The operation of the units 102 and 104 in a system where the reference signal is transmitted over the transmission network together with the traffic channel signal is illustrated in FIGS. 4 and 5.

FIG. 4 illustrates the operation of the unit 102, shown in FIG. 1, that transmits both the traffic channel signal $S_{401}$ and the reference signal $S_{REF}$ over the transmission network.

Typically, the reference signal $S_{REF}$ is transmitted on a different frequency band than the traffic channel signal $S_{401}$. The following examples discuss a case where the frequency of the reference signal $S_{REF}$ is $f_{REF}=13$ MHz. When the reference signal $S_{REF}$ is added to the signal $S_{401}$ in FIG. 4, which has a frequency of $f_{REF}=1951$ MHz, the total signal $S_{402}=S_{401}+S_{REF}$ is obtained for transmission to the mixer 402. The total signal includes two frequency components, $f_{TCH}$ and $f_{REF}$.

When the total signal $S_{402}$ is modified by the mixer 402 with the mixing signal with a frequency of $f_{MIX}=1405$ MHz, the signal $S_{403}$ is obtained. The signal $S_{403}$ includes four new frequency components, with the first two corresponding to the modulated traffic channel signal $S_{401}$ being converted into the center frequencies of $f_{TCH}+f_{MIX}=3370$ MHz and $f_{TCH}-f_{MIX}=546$ MHz, and the other two to reference signal $S_{REF}$ being converted into the frequencies $f_{REF}+f_{MIX}$ 32 1423 MHz and $f_{REF}-f_{MIX}=1397$ MHz. The band-pass filter 403 suppresses the components that do not fit in the frequency channel 545 MHz<f<555 MHz. The band-pass filter provides the signal $S_{404}$ to be transmitted to the transmission-network. Of the original signal $S_{403}$, the only component left is $f_{TCH}-f_{MIX}$, which operates at a frequency of 546 MHz.

FIG. 5 shows the adapting unit 104 at the receiving end, where the signal is re-converted into its original frequency of $f_{TCH}$. The transmission channel used is selected with the band-pass filter 501. The signal obtained, which is identical with the signal $S_{404}$ in FIG. 2, is mixed by the mixer 502 using the mixing signal $S'_{MIX}$. To ensure that the signal $S_{503}$ produced by the mixer is an exact copy of the signal $S_{402}$ in FIG. 4, the frequency of the mixing signal $S'_{MIX}$ must be exactly the same as that of the mixing signal $S_{MIX}$ in FIG. 4. Therefore, $S_{MIX}$ must be generated using the reference signal $S_{REF}$ to be transmitted over the transmission network. An attempt is made to regenerate the reference-signal from the signal $S_{503}$ by means of the band-pass filter 521. However, the synchronization signal $S_{REF}$ has been suppressed by the filter 403 in FIG. 4, so that $S_{503}$ does not include the necessary reference signal, and the signal $S_{REF2}$ obtained form the band-pass filter 521 is just noise. As a result, the phase-locked loop 511 does not receive its reference signal $S_{REF}$, and reconstruction of $S_{401}$ fails.

Consequently, it is the transmission of the reference signal that poses the problem in transmission. Because it is not possible to feed a signal external to the channel to the transmission system, the reference signal is filtered out by the band-pass filter. The idea of the present invention is to eliminate or at least alleviate the shortcomings of the state of the art. This objective is achieved by means of the method described in the enclosed independent patent claim.

BRIEF DESCRIPTION OF THE INVENTION

The idea of the invention is to convert the reference signal, prior to sending it to the transmission network, into a frequency that can be transmitted via the channel used by the transmission devices connected to the transmission network. The reference signal can be transmitted, for example, on a free channel reserved for a data signal or another channel specifically reserved for the transmission of the reference signal. At the receiving end, the reference signal is reconverted to its original frequency.

A reference signal transmitted together with the data signal via the same transmission path is very much subject to the same delays and non-ideal conditions as the data signal. Similarly, the phase and frequency differences of the reference and data signal remain unchanged in transmission. As a result, the transmitted data signal can be accurately reconstructed at the receiving end from the data signal converted for the transmission network channel involved.

In a preferred embodiment of the invention, the signal from the base transceiver station to the antenna unit is constructed in the form of a television signal. Then, the reference signal can be converted at the receiving end for a television voice channel, which makes it easy to deconstruct it at the receiving end by means of the voice circuits known from televisions.

LIST OF DRAWINGS

The invention is explained in more detail in reference to the enclosed drawings, where FIG. 1 shows an arrangement where signals between a base transceiver station and transmitter-receivers are transmitted via a separate transmission network;

A DETAILED DESCRIPTION OF THE INVENTION

Figure 1:
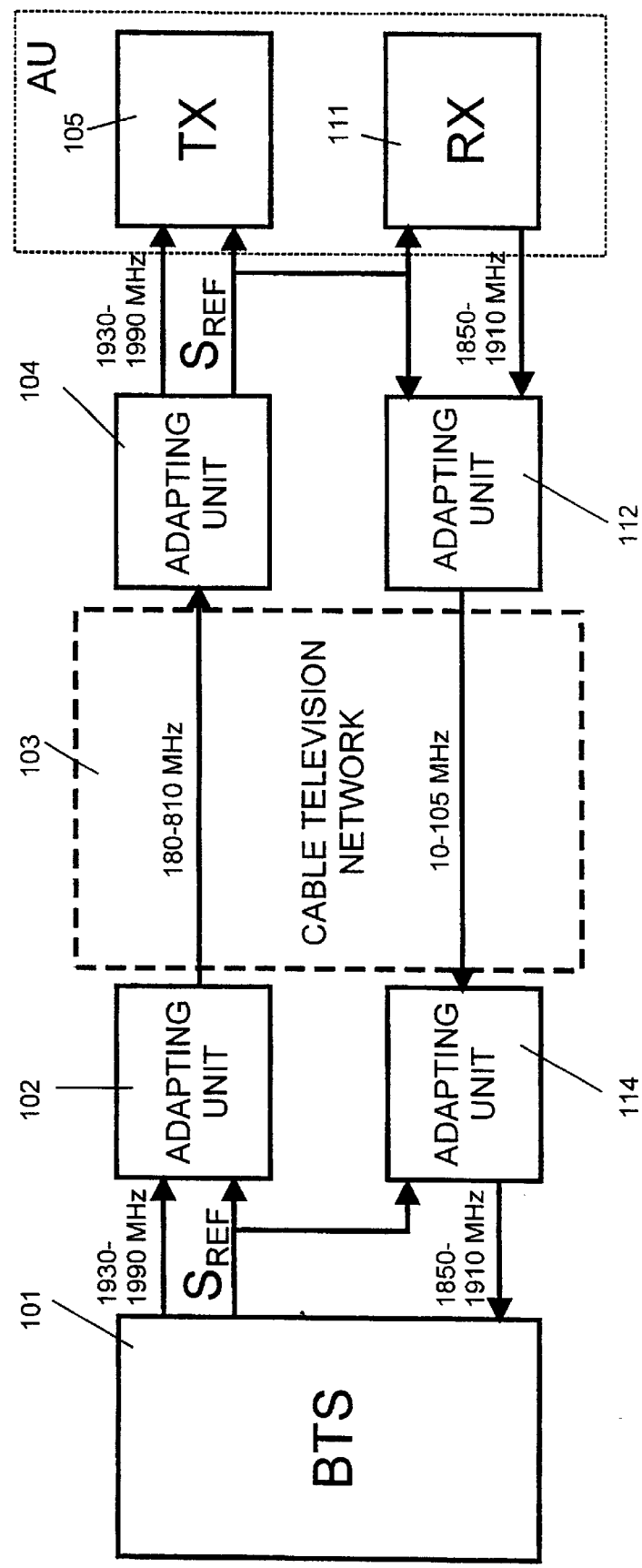
Figure 2:
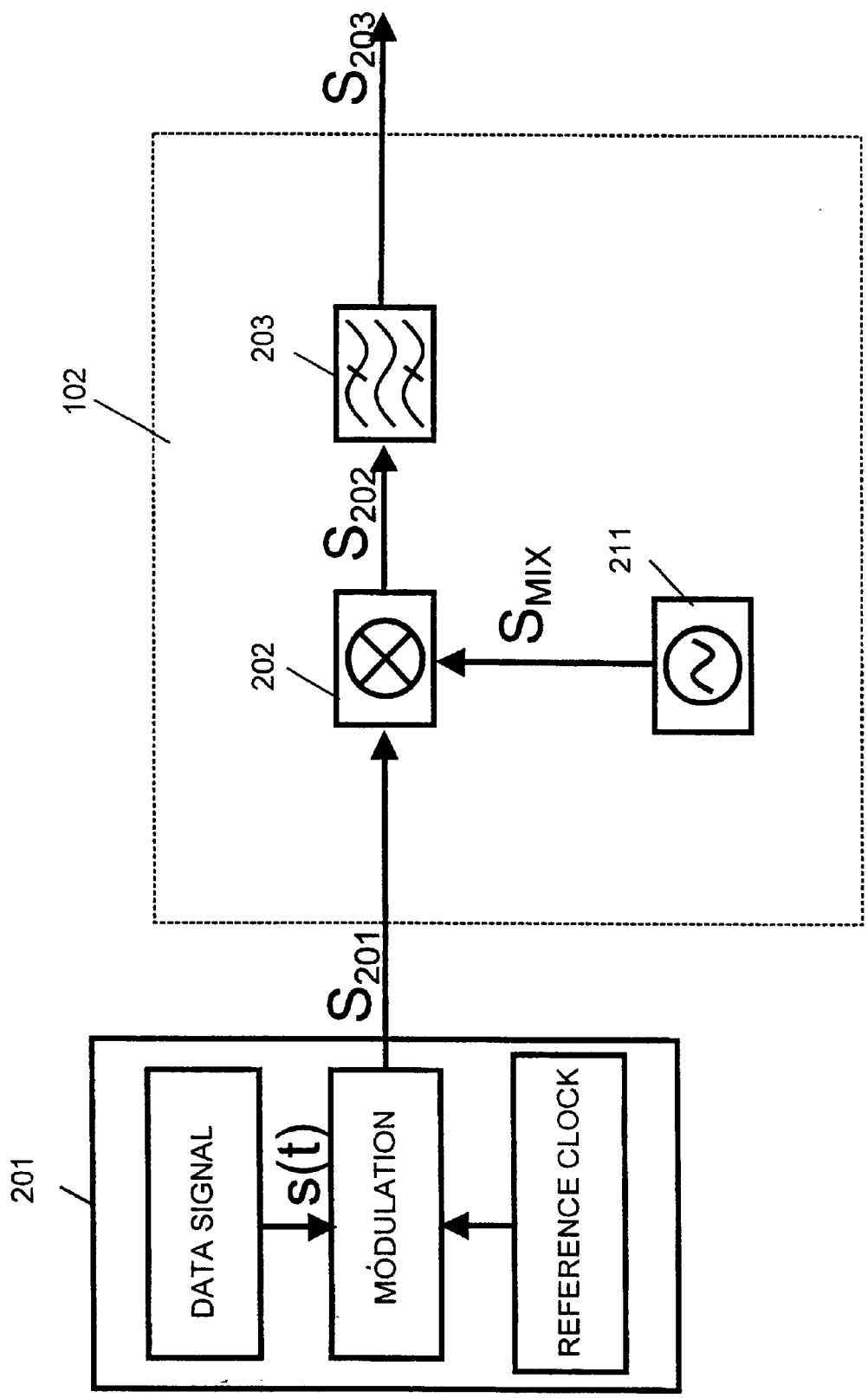
FIG. 2 shows the construction of a unit that feeds signals into the transmission network.
Figure 3:
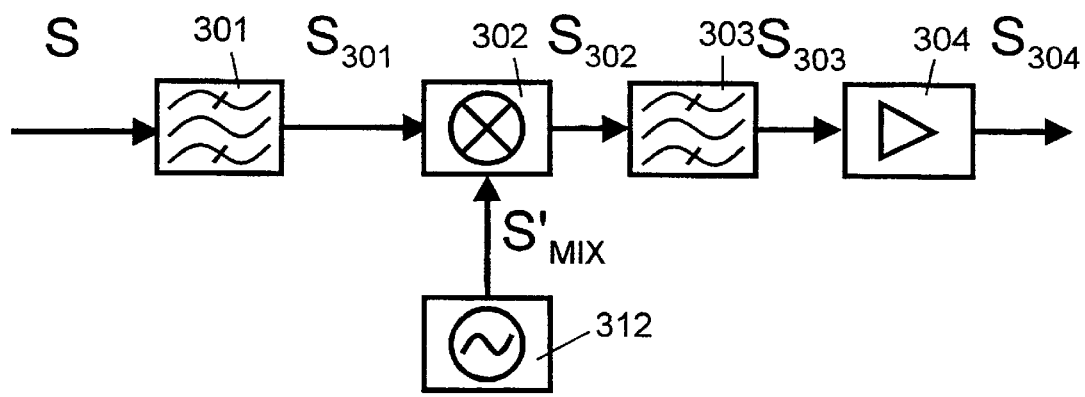
FIG. 3 shows the construction of a unit that reads signals from the transmission network.
Figure 5:
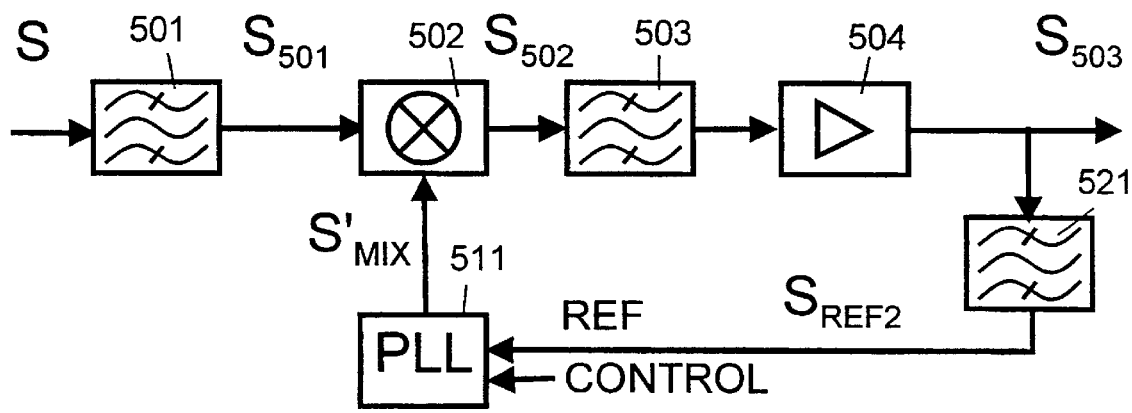
FIG. 5 shows the construction of the unit that reads the signal from the traffic channel of the transmission network.
Figure 4:
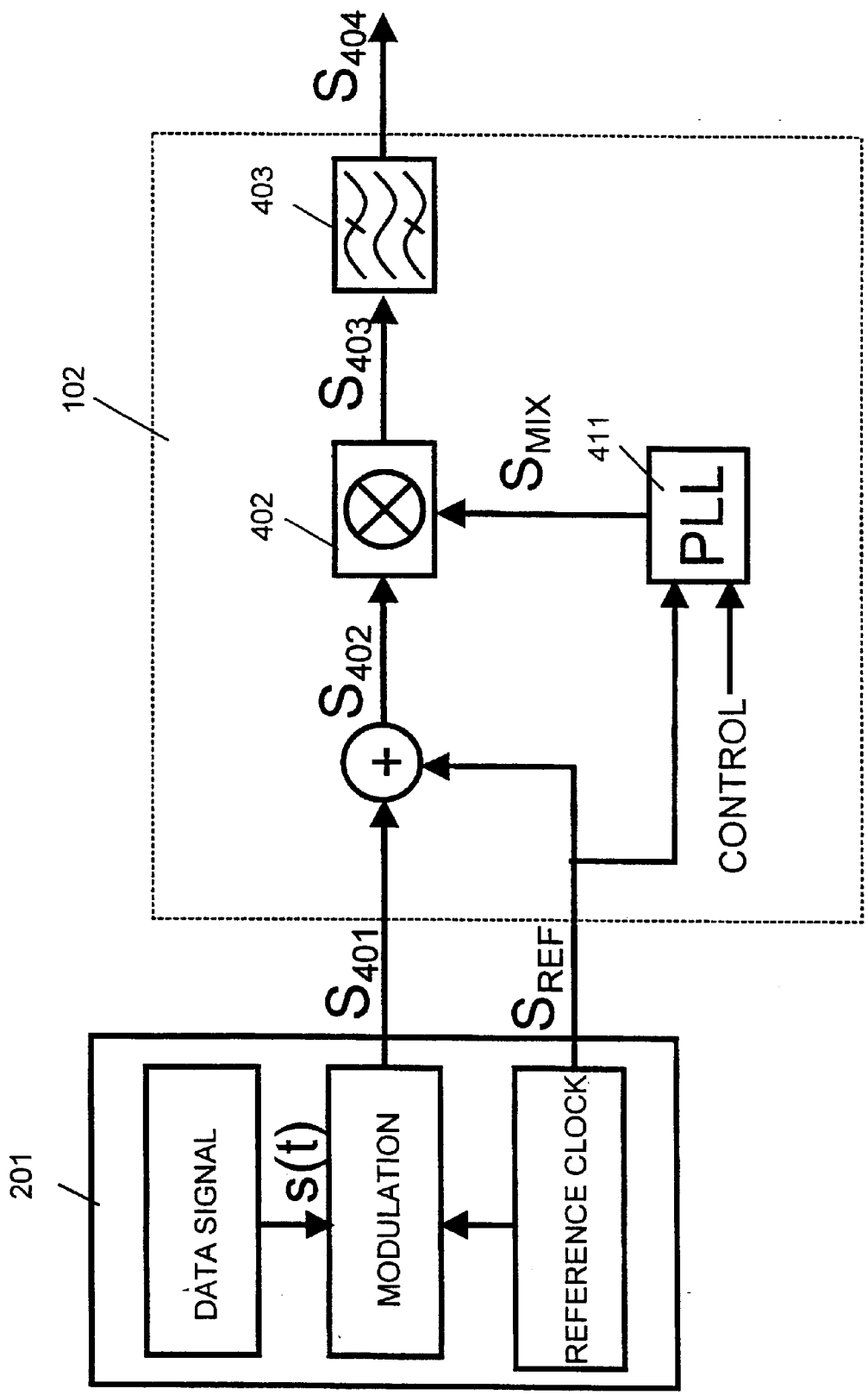
FIG. 4 shows the construction the unit that sends the traffic channel and the reference signal to the transmission network.
Figure 6:
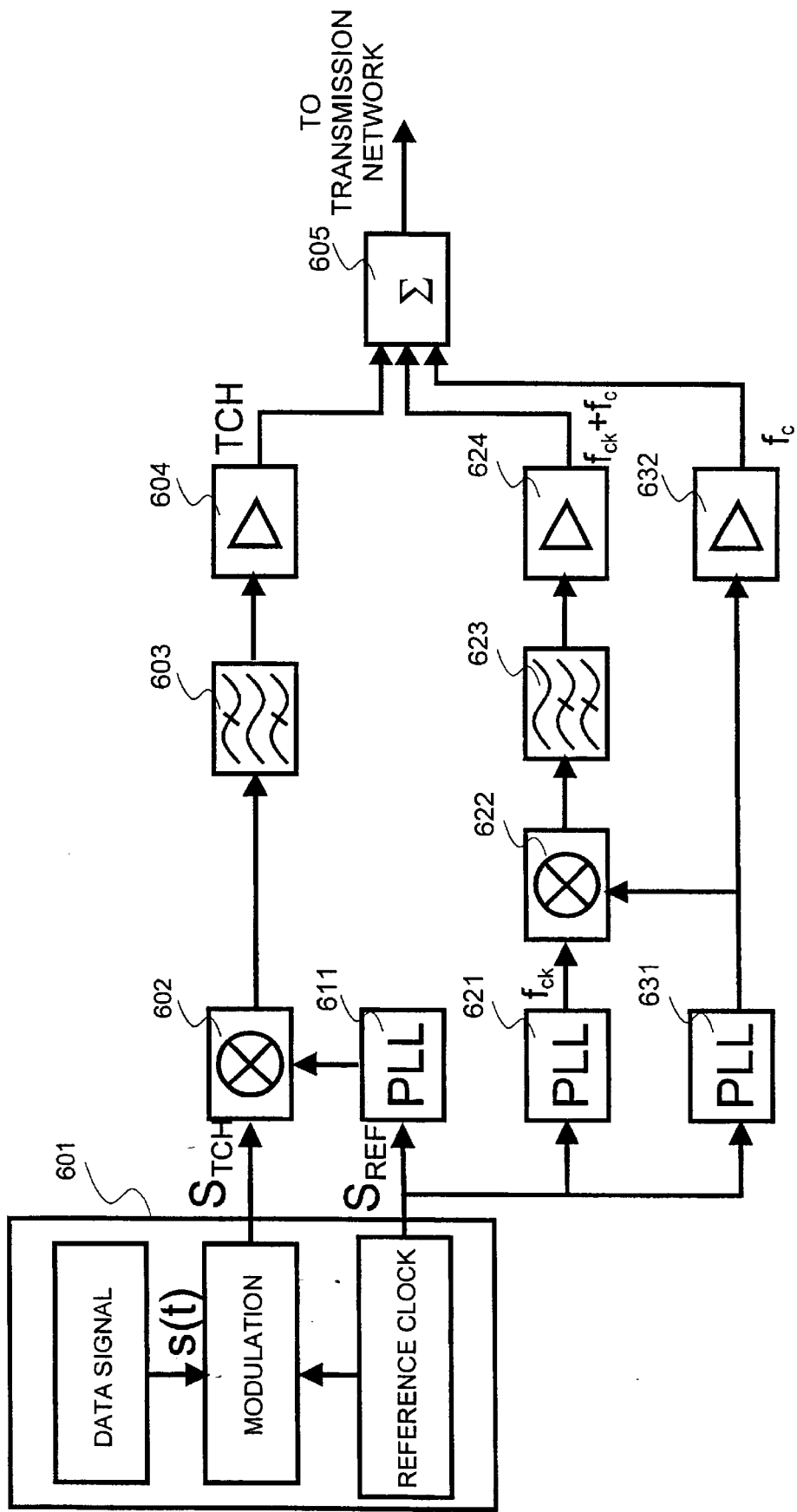
FIG. 6 shows the construction of a unit in accordance with the present invention that sends the traffic channel signal and the reference signal to the transmission network.

An example of the operation of the adapting unit shown in FIG. 1 in the first embodiment of the invention is illustrated in FIG. 6. The unit converts the signal from the base transceiver station to the antenna unit AU into a form that is consistent with the television standard applicable to the cable television network involved. Cable television networks use a television channel where the frequency of the carrier wave is 545 MHz.

Let us, again, analyze the processing of a single traffic channel signal. The signal $S_{TCH}$ with a center frequency of 1951 MHz to be transmitted from the base station transceiver BTS over a transmission network to the transmitter-receiver TRX is mixed by the mixer 602 with a signal with a frequency of 1405 MHz to be generated by the phase-locked loop 611 using the reference signal from the base transceiver station. As a result of mixing, two signal components with the frequencies 3356 MHz and 456 MHz are produced in addition to the signals to be fed into the mixer. A preferred mixer is a single side band mixer SSB, whereupon the band-pass or low-pass filter 603 can select with lower interference the signal component to be transmitted to the transmission network with a center frequency of 546 MHz The signal strength is set at the desired level using the amplifier 604.

The reference signal $S_{REF}$ with a frequency of 13 MHz is converted by the phase-locked amplifier 621 to the frequency $f_{ch}$=5 MHz, which is the difference in frequency between the audio channel and carrier wave signal in the television standard used in this example. In the next phase, the modified reference signal is mixed by the mixer 622 with the 545 MHz carrier wave of the television channel, which gives .the new frequencies of 540 MHz and 550 MHz for the mixer output signal. A preferred type for the mixer 622 is a single side band mixer SSB selecting the upper frequency branch, which makes it possible to employ the band-pass or high-pass filter 623 to select the signal component with a frequency of $f_c+f_{ch}$=550 MHz with greater accuracy. Finally, the signal is amplified by the amplifier 624 to achieve the desired signal strength. If necessary, a modem channel used for communications between the antenna unit and the network management system can be incorporated in the reference signal in addition to the frequency reference data by modulating the amplitude of this signal.

To up-mix the modified reference signal, the television channel carrier wave signal is used. The carrier wave signal is generated by means of the reference signal obtained from the base transceiver station using the phase-locked loop 631 to increase the 13 MHz frequency of the reference signal to the carrier wave frequency of 545 MHz. As well as the mixer 622, this signal is fed to the amplifier 632 to amplify it to the desired level.

Figure 7:
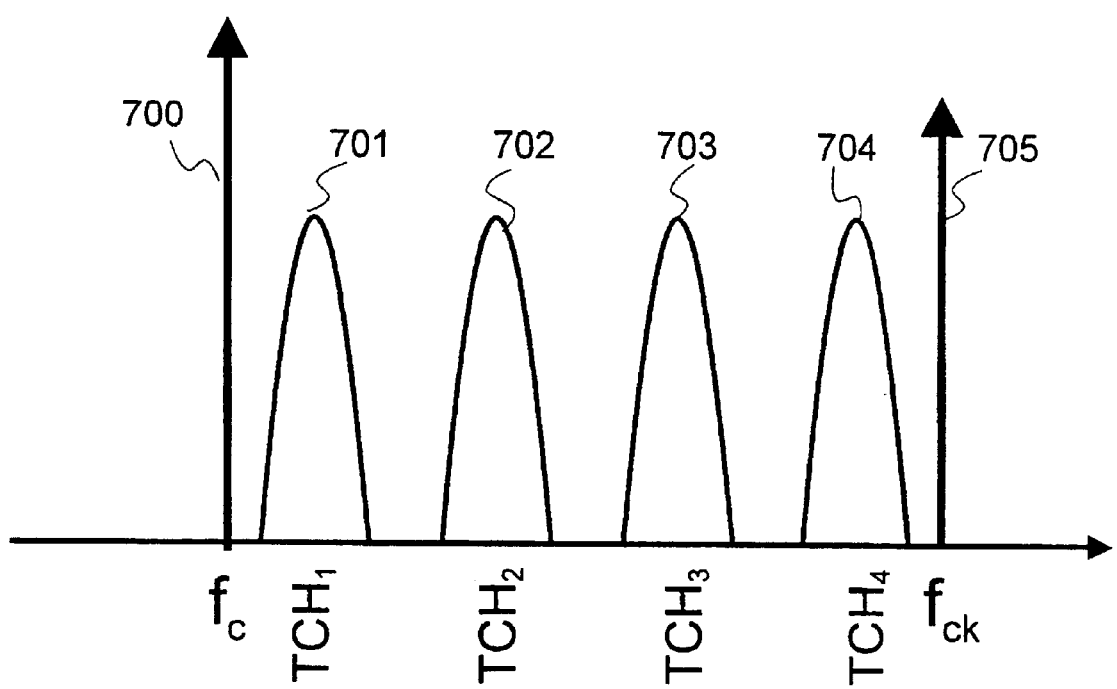
FIG. 7 shows the structure of the signal to be transmitted to the cable television network.

The signal to be sent on the cable television channel is adapted to the television standard used in the network involved by combining the signals described above using the summing unit 605. As shown in FIG. 7, the summing unit output includes the carrier wave frequency 700, the traffic channel signals 701–704 converted into the cable television frequency of the traffic channels and the reference signal 705 converted for the voice channel into the frequency $f_{ch}+f_c$.

Figure 8:
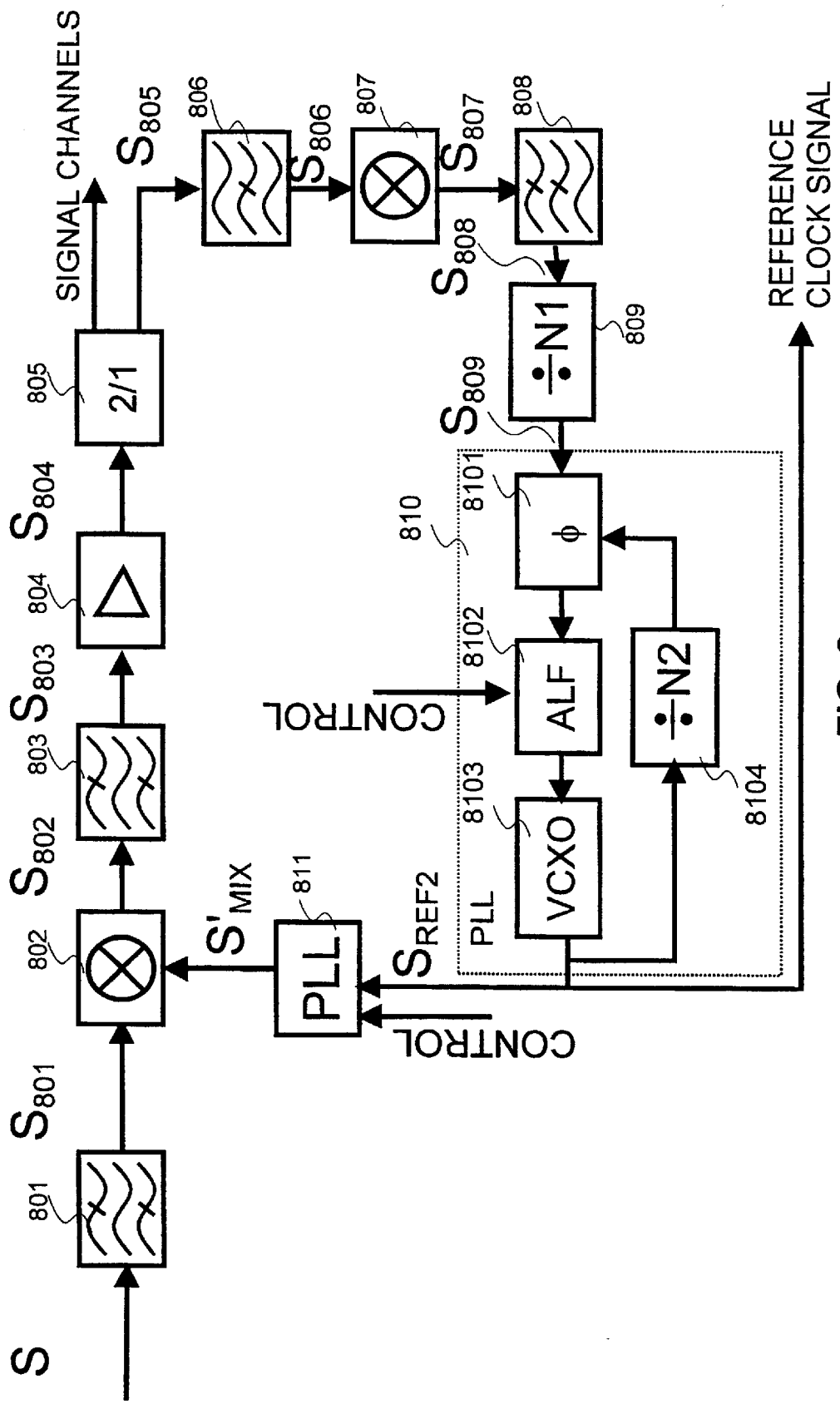
FIG. 8 shows the construction of a unit in accordance with the present invention that reads the traffic channel signal and the reference signal from the transmission network.

The antenna unit AU processes the signal as shown in FIG. 8. First, the television channel used for transmission in the cable television network is selected using the band-pass filter 801. The pass band of the band-pass filter can preferably be controlled by a voltage regulator. In this case, the filter allows the frequencies 545–550 MHz to pass through. Next, the signal is modified to an intermediate frequency by mixing it in the mixer 802 using a mixing signal, which has a frequency of 38.9 MHz or 45 MHz below the carrier wave of the signal depending on the television standard used, generated from the antenna unit reference frequency $S_{REF2}$ by means of the phase-locked loop 811. In this case, the intermediate frequency IF used is 45 MHz, which gives a mixing signal $S_{MIX}$ frequency of 500 MHz. Preferably, the mixer consists of a single side band mixer, which facilitates the filtering of the desired signal components. The filter 801, mixer 802 and phase-locked loop 811 together constitute a channel selector component commonly used in television technology.

In addition to the mixing signal $S_{MIX}$, and the television channel frequencies passed by the band-pass filter 801, the mixer 802 output $S_{802}$ includes the 40–50 MHz and 1045–1050 bands obtained as a result of mixing. The band-pass or low-pass filter 803 is employed to select the frequencies 45–50 MHz that make up the intermediate frequency. The signal is amplified by the amplifier 804 and duplicated by the power splitter 805. One of the power splitter 805 outputs is used for regenerating the traffic channel signals and the other output for regenerating the reference signal to be transmitted over the transmission network of the base transceiver station. No more detailed description of the further processing of the traffic channels is provided here.

The power splitter output used for regenerating the reference signal is fed into the band-rejection filter 806 that is used for filtering the traffic channel signal frequencies 40.2–44,8 MHz. Thus, the filter output $S_{806}$ only contains the carrier wave and reference signals converted into the frequencies 40 MHz and 45 MHz. These signal components are mixed by the mixer 807 whose output will, in addition to input, include the frequency $f_{ch}$=5 MHz and its collateral, which has a frequency of 95 MHz. Of these frequencies, the frequency 5 MHz is selected by the filter 807. To compensate for the amplitude changes due to the transmission channel or the interference caused by, the amplitude modulation of the signal at the transmitting end, a regenerating block may be positioned after the mixer 807 or filter 808 to analyze changes in the signal zero points and to give a constant-amplitude output.

It should be pointed out that the (practically identical) errors in the carrier wave and the reference signal converted for the voice channel, caused by the components and non-ideal performance of the transmission channel, cancel each other out. As a result, the signal $S_{808}$ obtained in this way is an exact copy of the 5 MHz signal generated from the base transceiver station BTS reference signal $S_{REF}$ by the phase-locked loop 621 in FIG. 6. Now the reference signal can be accurately regenerated by multiplying the frequency of this signal by the factor 13/5. This is accomplished with the divider 809 and phase-locked loop 810.

In the divider 809, the signal frequency is divided by the factor 5, which yields a signal with a frequency of 1 MHz for one of the two inputs of the phase comparator 8101 of the phase-locked loop 810. The output from the phase comparator 8101 is fed into the active loop filter ALF, whose output voltage is used for controlling the voltage controlled crystal oscillator 8103, which has a natural frequency of 13 MHz. The oscillator output is connected to the seconds input of the phase comparator via the divider 8104. In the divider 8104, the frequency of oscillator output signal is divided by 13, which gives a signal comparable to the output signal of the divider 809.

The natural frequency of the crystal oscillator is 13 MHz and its adjustment range narrow, for example ±10 ppm. As a result, the crystal oscillator frequency is always so close to the correct reference frequency that the device can, by means of the mixing signal generated from the output signal with the phase-locked loop 811, always lock onto the right television channel. The reference signal specified for the new frequency obtained from this channel using a known method can be regenerated by modifying the crystal oscillator output with the phase-locked loop 810 to make it compatible with the base transceiver station reference signal $S_{REF}$. As a result, the crystal oscillator frequency will be accurately set to the reference signal frequency, which makes it possible to use the crystal oscillator output signal $S_{REF2}$ as the reference clock for the entire antenna unit when reconstructing traffic channel signals converted into the television channel frequencies by means of the base transceiver station reference signal, generating the traffic channel signals to be sent from the antenna unit to the base transceiver station, and transmitting data between the antenna unit and the unit that controls its operation.

Figure 9:
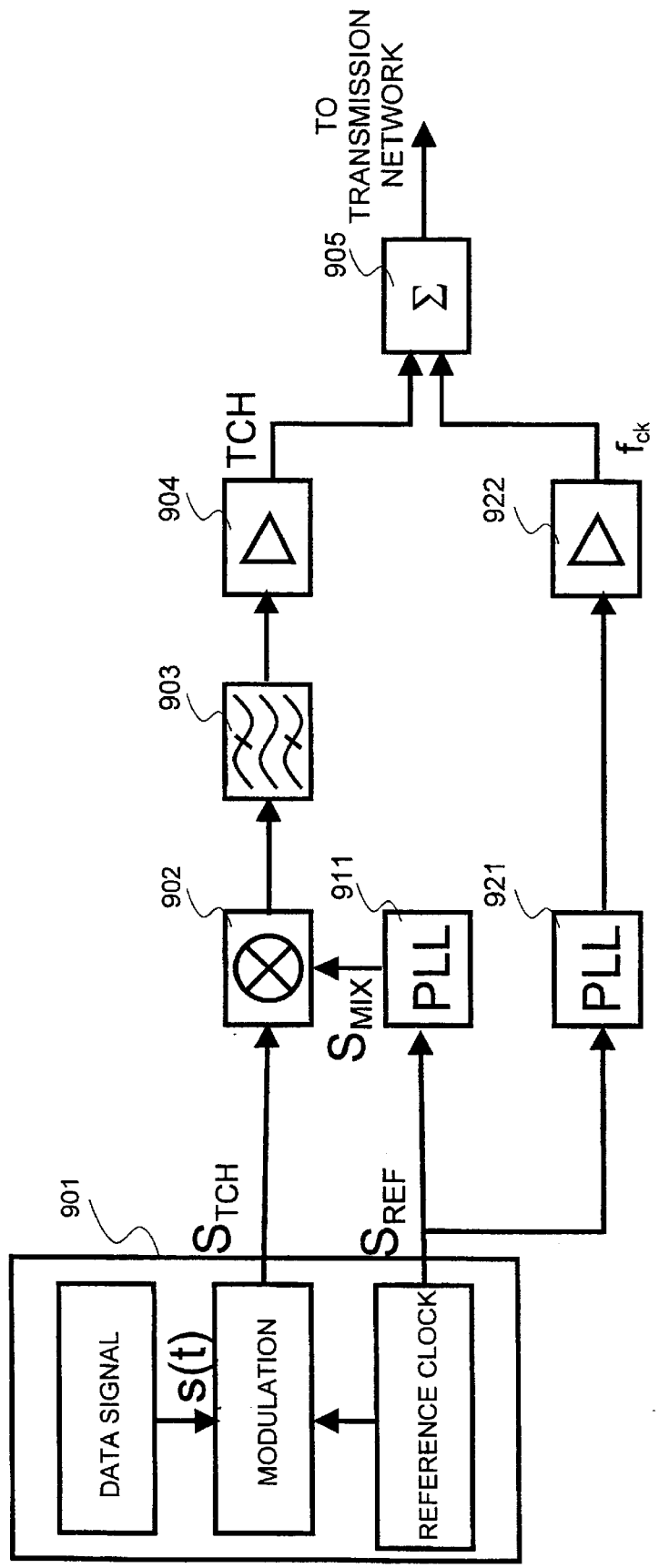
FIG. 9 shows the construction of a unit in accordance with the present invention that sends the traffic channel signal and the reference signal to the transmission network.
Figure 10:
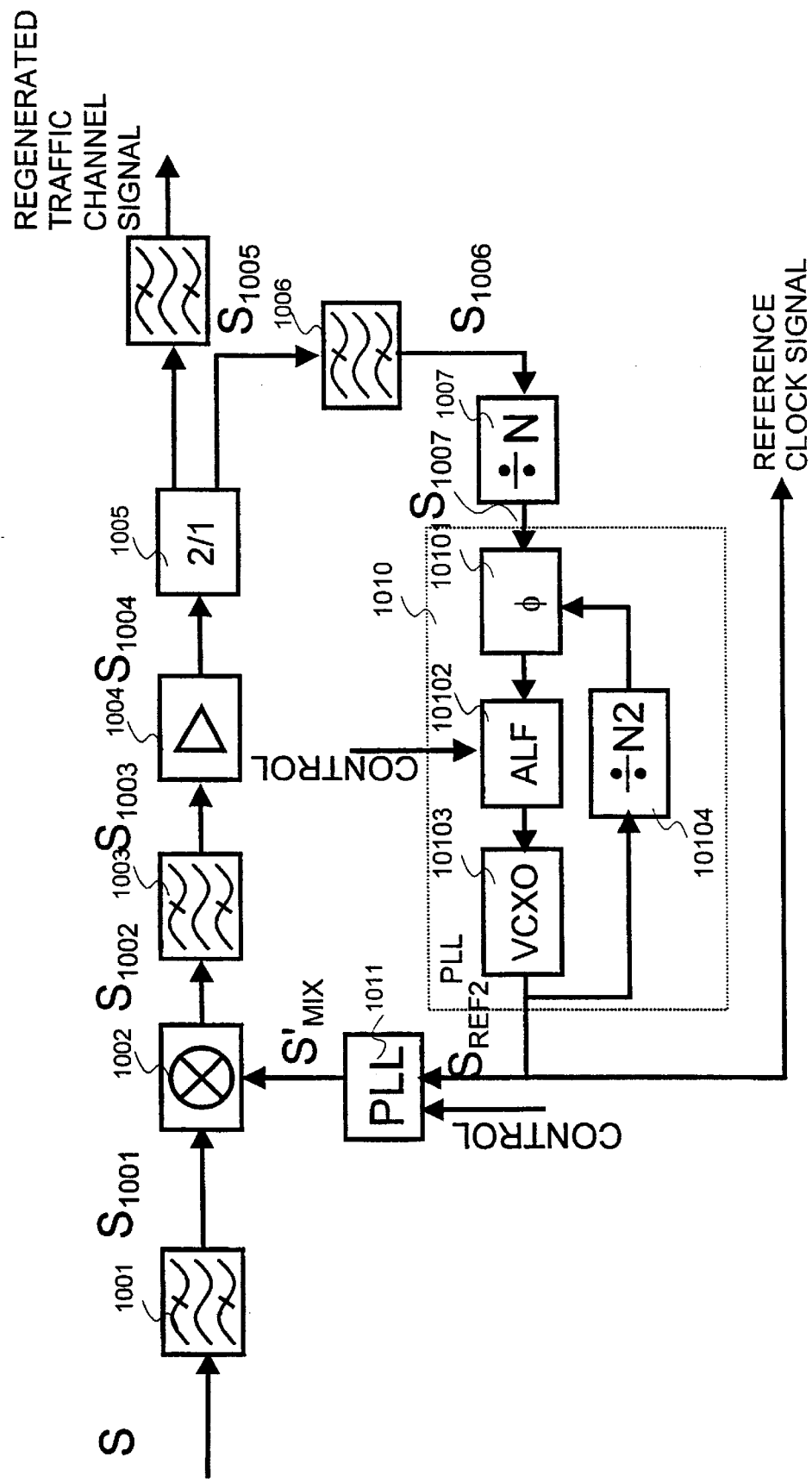
FIG. 10 shows the construction of a unit in accordance with the present invention that reads the traffic channel signal and the reference signal from the transmission network.

FIGS. 9 and 10 depict another method in accordance with the invention for transmitting reference signals over the transmission network from one device to another. FIG. 9 shows a unit that transmits the reference signal to the transmission network. Let us, again, examine the same traffic channel whose frequency is 1951 MHz and which is transmitted over the transmission network at a frequency of 546 MHz.

The modulated traffic channel signal $S_{TCH}$ is mixed by the phase-locked loop 911 using a 1405 MHz mixing signal generated from the reference signal of the base transceiver station. In addition to the inputs, the mixer output includes signals with the frequencies of 546 MHz and 3356 MHz. Of these, the band-pass filter 903 selects the signal component with a frequency of 546 MHz to be sent to the transmission network. This component is amplified to the required level with the amplifier 904.

The reference signal is converted by the phase-locked loop 921 to the frequency of 550 MHz and amplified to the required level with the amplifier 922. Finally, the signals are combined by the summing unit 905 and sent to the transmission network.

FIG. 10 shows the unit that regenerates the signal to be sent to the network as described above. The transmission network signal is filtered by the band-pass filter 1001, which is used for selecting the transmission network band used for transmission. The signal $S_{1001}$ thus contains the signal components with the frequencies $f_{TCH}$=546 and $f_{ch}$=550 MHz. This signal is mixed with the 1405 MHz mixing signal generated form the receiver reference signal $S_{REF2}$. In addition to the input signals, the mixer outputs include the frequencies 859, 855, 1951 and 1955 MHz. The band-pass filter 1003 is used to select the original 1950–1960 MHz frequency range of the traffic channel signal.

The signal $S_{1003}$ contains two signal components, the modulated traffic channel signal with an intermediate frequency of $f_{TCH}$=1951 MHz and the 1955 MHz signal that carries the reference signal. This signal is amplified by the amplifier 1004 to obtain the signal $S_{1004}$.

To distinguish the modulated traffic channel signal form the reference signal, the signal $S_{1004}$ is duplicated with the power divided 1005, from one output of which the frequency used for the transmission of the reference signal is filtered. The signal obtained is a copy of the traffic channel signal transmitted by the base transceiver station. The other output from the power splitter is connected to the band-pass filter 1006 to filter the frequency $f_{ch}$=1955 MHz from the signal. The signal $S_{1006}$ thereby obtained contains only the reference signal converted into the traffic channel frequency, and it will be fed into the divider 1007. In the divider 1007, the signal frequency is divided by the factor N1=1955, which gives a 1 MHz signal to one of the inputs of the phase comparator 10101 of the phase-locked loop 1010. Based on the phase comparator output, the active loop filter ALF controls the voltage controlled crystal oscillator VCXO, whose output is connected to the other input of the phase comparator via the divider 10104. In the divider 10104, the signal frequency is divided by the factor 13, which induces .the crystal oscillator to oscillate exactly at the base transceiver station reference signal frequency of 13 MHz.

To enable the receiver to identify and lock onto the channel used for transmitting the reference signal, the phase-locked loop 1011 that generates the mixing signal $S'_{MIX}$ must, already in the start-up phase, have access to a frequency reference that is sufficiently close to the reference frequency $f_{REF}$. To achieve this, a voltage controlled crystal oscillator VCXO with a close adjustment range (such as ±10 ppm ) and operating near the 13 MHz reference signal frequency is selected for the oscillator in the phase-locked loop. The idea with using a VCXO is that although the output signal form the.divider 1007 is (for example, during start-up) relatively far from the target value of $f_{REF}/13$, the output from the loop 1010 is close enough to the value $f_{REF}$ to make it possible, by means of the mixing signal $S_{MIX}$ generated on the basis of the loop output,for the device to lock onto the channel used for transmitting the reference signal. After that, the phase-locked loop 1010 locks its output $S_{REF2}$ onto the reference signal $S_{REF}$ transmitted. Consequently, the signal $S_{REF2}$ can be used as the reference signal by the receiver units.

At the transmitting end shown in FIG. 9, the mixing signal $S_{MIX}$ and traffic channel signal $S_{TCH}$ were formed using the reference signal $S_{REF}$ as the reference value. Since the mixing signal $S'_{MIX}$ at the receiving end is generated by using the same reference signal for reference, no frequency errors occur in transmission. As a result, the regenerated traffic channel signal is (except for amplification) a relatively exact copy of the signal $S_{TCH}$ of the transmitting end. Similarly, the difference in frequency between the regenerated traffic channel signal and the reference signal $S_{REF2}$ is identical to that between the signals $S_{TCH}$ and $S_{REF}$ in FIG. 9. In addition, the traffic channel signal transmitted over the transmission network has undergone more or less the same delay as the transmitted reference signal. Thus, the signal $S_{REF2}$ can be used for synchronizing the transmitter TX, receiver RX and adapting units 104 and 112 shown in FIG. 1.

The invention is not limited to the embodiments described above. For example, the reference signal can be, converted to the traffic channel signal band and combined, as explained in the examples, with the traffic channel signal before it is converted into the format used in the transmission network. A reference in a new frequency can also be transmitted completely separately from the traffic channel signal on a separate television channel. However, then the changes that signals travelling along different transmission paths undergo may differ from one another more, which may, in certain situations, increase the bit error ratio in the traffic channels.

Conversion of the reference signal into the frequency band used in the transmission network can be carried out in various ways, of which the multiplication of the frequency and the mixing of the signal are just presented by way of an example. For example, the frequency dividers can naturally be replaced by correctly positioned frequency multipliers and vice versa. Instead of the procedures described above by way of an example, the reference signal may be converted essentially into the traffic channel signal band and then mixed with the payload signal, i.e. the traffic channel signals, for the band used in the transmission network. If so, selection of the traffic channel frequency used for the reference signal must be made with due regard to the risk of the various signals components overlapping when mixed.

The frequency ranges to be used for the traffic signal are not essential to the invention, but could, instead of the GSM-1900 frequencies used in this example, consists of GSM frequencies, meaning that the signal from the base transceiver station to the transmitter TX can be on the 935–960 MHz band and the signal from the receiver to the base transceiver station on the 890–915 MHz band, or DCS-1800 frequencies, in which case the signal from the base transceiver station to the transmitter TX is on the 1805–1880 MHz band and the signal from the receiver to the base transceiver station on the 1710–1785 MHz band. Any other frequency ranges can naturally be used. At the receiving end, the traffic channel signals can be specified for a traffic channel other than that used at the transmitting end. Nor does the signal from the base transceiver station to the antenna unit have to be at the traffic channel frequency, but it may also be at any of the intermediate frequencies.

The method used for the modulation of the traffic channel signal is not essential, either. For example, amplitude or frequency modulation may be employed in addition to, or instead of, the phase modulation technique used in the example.

The invention is not limited to the transmission of the reference signal for data communications between the base transceiver station and transceiver unit. The method in accordance with the present invention can be used in all systems where the reference signal between the transmission devices passes through a transmission network. There may be more than one unit for receiving the reference signal, in which case several units lock onto a common reference frequency. This type of arrangement is particularly useful for point-to-multipoint transmission systems involving one device with several sub-devices. Naturally, the frequency ranges for the modulated signal and reference signal cited in the embodiments presented above are not essential to the invention. The invention may be used in the same manner for the transmission of signals in other frequency ranges. Nor is the transmission network involved essential to the invention, and the cable television network used in the examples can be replaced by some other telecommunications network.

What is claimed is:

1. A method for synchronizing first and second telecommunications devices via a transmission network, the method comprising the steps of:

converting a reference signal into a frequency band used in the transmission network by mixing it with another signal;

converting a payload signal into the frequency band used in the transmission network;

combining the converted reference and payload signals;

transmitting the combined signal from the first device to the second device via the transmission network;

extracting the reference signal and reconverting it back to its original frequency; and synchronizing the second device with the first device using the reconverted reference signal.

2. The method in accordance with patent claim 1, wherein a converted reference signal transmitted by one device is used for generating a reference signal for several other devices.

3. The method in accordance with patent claim 1, where the first and second device are part of the same system, wherein the transmission network is external to the first and second device.

4. The method in accordance with patent claim 3, wherein the transmission network is a cable television network.

5. The method in accordance with patent claim 4, wherein the reference signal is converted for a television voice channel.

6. The method in accordance with patent claim 1, wherein the first device is a base transceiver station in a mobile communications system and the second device an antenna unit in a mobile communications system.

7. The method in accordance with claim 1, wherein the reference signal is converted into the frequency band of the payload signal prior to converting it to the frequency band of the transmission network.

8. An arrangement for synchronizing first and second telecommunications devices via a transmission system, wherein the first device includes first mixing means for converting a reference signal into a first frequency band used in the transmission network by mixing it with a first auxiliary signal, includes means for converting a payload signal into the first frequency band, and includes combining means for combining the converted payload and reference signals; and wherein:

the first device includes transmission means for transmitting the combined converted payload and reference signals to the second device via the transmission network; and the second includes second mixing means for extracting and reconverting the converted reference signal from the combined signal back to its original frequency, wherein the second device is configured to synchronize with the first device on the basis of the reconverted reference signal.

9. The arrangement in accordance with patent claim 8, wherein the first mixing means are adapted to convert the reference signal for a television voice channel.

10. The arrangement in accordance with patent claim 9, wherein the second mixing means are adapted to convert the reference signal from the television voice channel into its original frequency.

11. The arrangement according to claim 8, wherein the first device includes means for converting the reference signal into the frequency band of the payload prior to converting it to the frequency band of the transmission network.

* * * * *